United States Patent [19]

Camp

[11] Patent Number: 5,726,623

[45] Date of Patent: Mar. 10, 1998

[54] THERMISTOR MOUNTING ARRANGEMENT

[75] Inventor: Philip George Camp, Taunton, United Kingdom

[73] Assignee: Bowthorpe Components Limited, West Sussex, United Kingdom

[21] Appl. No.: 704,496

[22] PCT Filed: Feb. 28, 1995

[86] PCT No.: PCT/GB95/00427

§ 371 Date: Aug. 26, 1996

§ 102(e) Date: Aug. 26, 1996

[87] PCT Pub. No.: WO95/24045

PCT Pub. Date: Sep. 8, 1995

[30] Foreign Application Priority Data

| Mar. 1, 1994 | [GB] | United Kingdom | 9403913 |
| Mar. 24, 1994 | [GB] | United Kingdom | 9405863 |
| Oct. 25, 1994 | [GB] | United Kingdom | 9421454 |

[51] Int. Cl.$^6$ .................... H01C 7/10; H01C 7/13
[52] U.S. Cl. .................................................. 338/22 R
[58] Field of Search ............................ 338/22 R, 307, 338/312, 313, 328, 330

[56] References Cited

U.S. PATENT DOCUMENTS

| 5,351,026 | 9/1994 | Kanbara et al. | 338/22 R |
| 5,446,623 | 8/1995 | Kanetake | 361/760 |

FOREIGN PATENT DOCUMENTS 3638342  5/1988  Germany.

*Primary Examiner*—Edward Tso
*Attorney, Agent, or Firm*—Edward D. Schindler

[57] ABSTRACT

A temperature dependent resistive component (10) has two supports (12, 14) attached to its respective opposite faces, each support having at least one projecting leg which terminates in a contact pad (13 or 14), the contact pads of the two supports (12, 14) lying in a common plane spaced from the component (10), for mounting the component to a substrate. Each support may comprise a wire bonded to the respective face of the component, or a piece of sheet material bent to channel-section and bonded via its edges to the face of the component. The common plane, in which the contact pads lie, may be parallel to but spaced from one face of the component, or perpendicular to the opposite faces of the component and spaced from its edge.

4 Claims, 3 Drawing Sheets

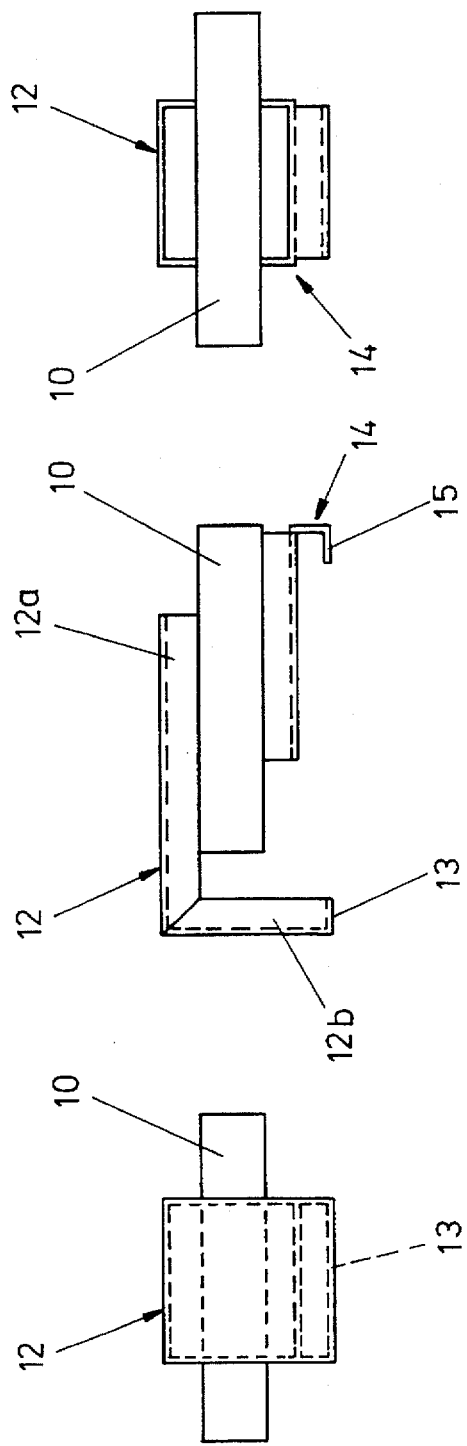

THERMISTOR MOUNTING ARRANGEMENT

BACKGROUND OF THE INVENTION

The present invention relates to an electrical component the resistance of which varies with temperature, and more particularly to a thermistor having a positive temperature coefficient (such that its resistance increases with temperature).

In many uses, thermistors carry heavy electrical currents and generate considerable heat. This heat must be dissipated in a controlled and reliable manner.

We have now devised a thermistor which can be surface-mounted to a substrate, such that it occupies relatively little space but allowing controlled dissipation of heat.

SUMMARY OF THE INVENTION

In accordance with this invention as seen from one aspect, there is provided a temperature dependent resistive component comprising opposite contact faces and two supports attached to the respective contact faces, each support having at least one projecting leg which terminates in a contact pad, the contact pads of the two supports lying in a common plane spaced from the component, for mounting to a substrate.

Preferably the component comprise a flat, disc-shaped element. In one embodiment, the two supports comprise two wires bonded to the disc across two angularly-spaced diameters thereof. Preferably the opposite ends of each wire project and are flattened to form contact pads.

In another embodiment, each support comprises a piece of sheet metal bonded to the respective face of the disc and provided with the projecting leg which terminates in the respective contact pad. Preferably the support is bonded to the respective side of the disc via one or more edges of the piece of sheet metal. Preferably the contact pad comprises a portion of the sheet metal, bent to lie in the required plane. Preferably each support comprises a piece of sheet metal bent into a channel-section, the two edges of the channel-section being bonded to the respective face of the disc.

In accordance with this invention as seen from a second aspect, there is provided a temperature dependent resistive component comprising opposite contact faces and two supports attached to the respective contact faces, each support having at least one projecting leg which terminates in a contact pad, with respective contact pads of the two supports lying in a common plane spaced outwardly from said component, for mounting the component to a substrate, at least one support comprising a piece of sheet metal bent into a channel-section and having the two edges of the channel-section bonded to the respective face of said component.

The component is preferably a PTC thermistor and is arranged to be mounted such that its underside lies either parallel or perpendicular to the substrate, but spaced by a small gap from the substrate. The dissipation of heat from the thermistor depends upon the surface area, cross-sectional area, contact pad area and material of the supports, and also the distance between the thermistor and the substrate. These parameters can be selected, in the design of the thermistor, to suit the heat dissipation requirements of particular applications.

BRIEF DESCRIPTION OF THE DRAWING FIGURES

Embodiments of this invention will now be described by way of examples only and with reference to the accompanying drawing, in which:

FIG. 2 is a side view of a second embodiment of PTC thermistor in accordance with the invention;

FIG. 3 is a view of the thermistor of FIG. 2 from one end;

FIG. 4 is a view of the thermistor of FIG. 2 from the opposite end;

FIG. 5 is a plan view of the thermistor of FIG. 2;

DETAILED DESCRIPTION OF THE DRAWING AND PREFERRED EMBODIMENTS

Figure 1:
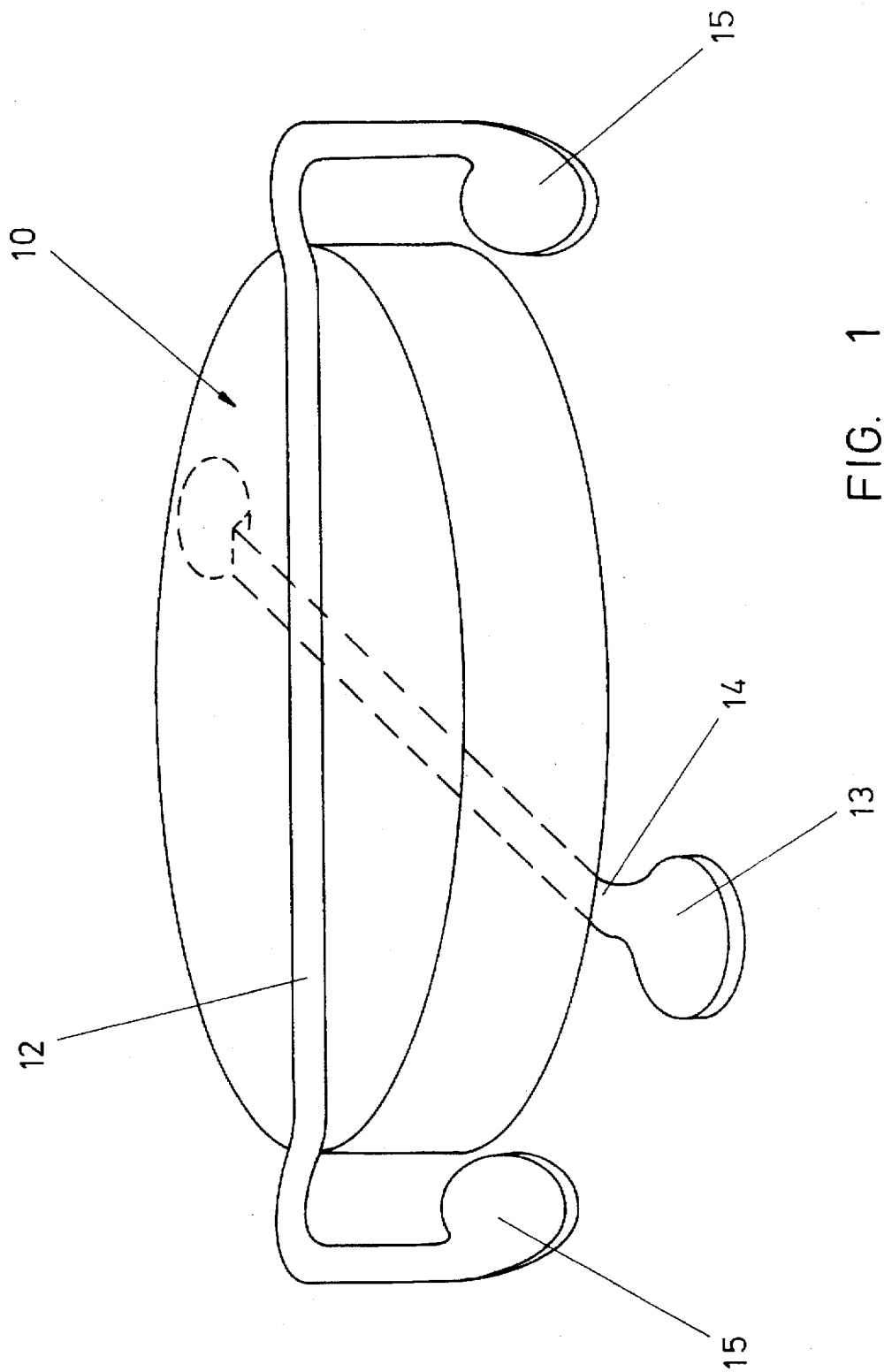
FIG. 1 is a perspective view of one embodiment of PTC thermistor in accordance with the invention.
Figure 7:
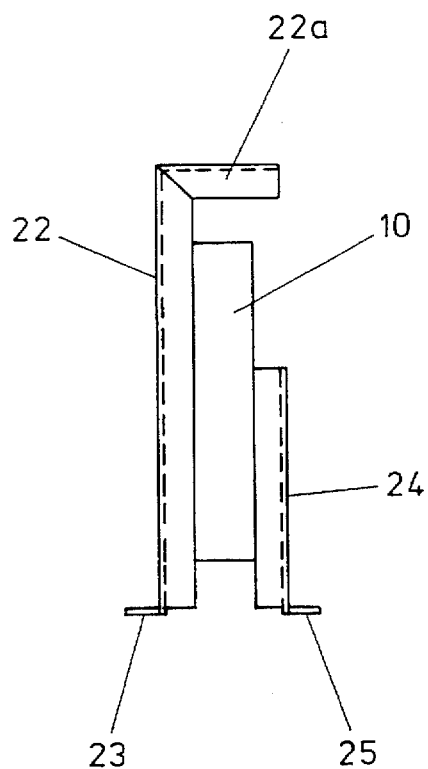
FIG. 7 is a view of the thermistor of FIG. 6 from one edge.
Figure 6:
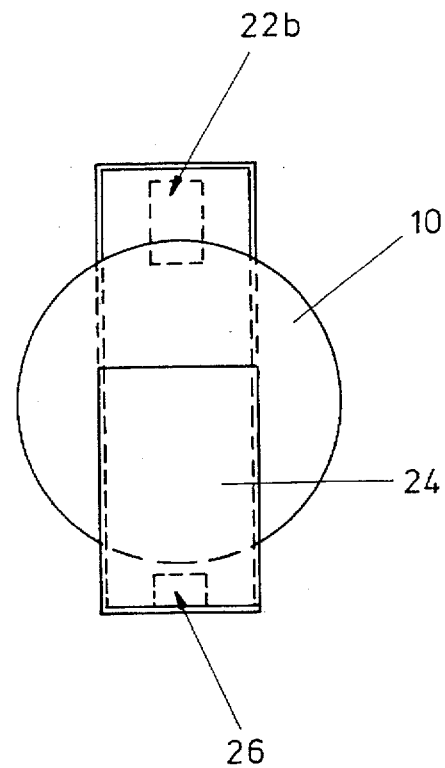
FIG. 6 is a side view of a third embodiment of thermistor in accordance with the invention.
Figure 8:
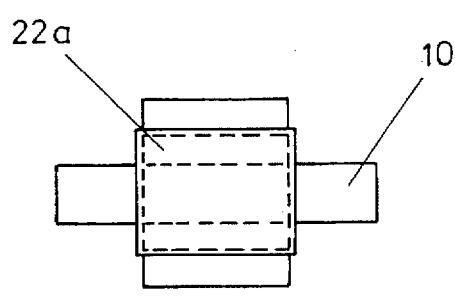
FIG. 8 is a top view of the thermistor of FIG. 6.
Figure 9:
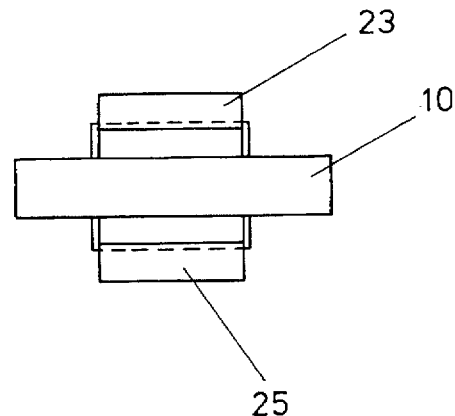
FIG. 9 is a bottom view of the thermistor of FIG. 6.

Referring to FIG. 1 of the drawings, there is shown a disc-shaped thermistor 10 having a positive temperature coefficient (PTC) and arranged for surface-mounting to a substrate (not shown). The opposite faces of the disc 10 are each provided with a conductive coating, for contact purposes. The thermistor is further provided with two supports 12, 14. Support 14 comprises a length of wire bonded to the underside of the disc 10 across a diameter thereof, and having its opposite ends bent downwardly then outwardly and flattened, to form contact pads 13 (one shown). Support 12 comprises a length of wire bonded to the upperside of the disc 10 across a diameter thereof (at right angles to support 14), and having its opposite ends bent downwardly then inwardly and flattened, to form contact pads 15. The four contact pads 13, 15 all lie in a common plane, parallel to but spaced from the underside of the disc 10.

FIGS. 2 to 5 show a second embodiment of support arrangement for the disc-shaped thermistor 10. In this, the support 12 is formed from a strip of sheet metal having margins along its opposite edges, bent through 90°: further, these margins have been formed with a V-shaped cut-out and then the strip has been bent to 90°, forming a first channel-section portion 12a and second channel-section portion 12b, at 90° to the first portion. A margin at the end of the second portion 12a is bent through 90° to form a contact pad 13. The support 12 is secured to the thermistor 10 with its first portion 12a extending across the upper side of the disc and with the edges of its margins lying against and bonded (e.g. soldered) to this upper side of the disc, whilst the second portion 12b projects downwardly across (but spaced from) the edge of the disc. Support 14 similarly comprises a strip of sheet metal having margins along its opposite edges bent through 90° to form a channel section, and having a portion at one end bent in the opposite direction through 90° and then through a further 90° to form a contact pad 15. Support 14 is secured to the underside of the thermistor 10, extending across the disc and with the edges of its margins lying against and bonded (e.g. soldered) to this underside of the disc. The two contact pads 13, 15 lie in a common plane which is spaced from the underside of the disc 10. The supports 12, 14 may be made of an electrically conductive material such as brass, copper or mild steel plated with lead alloy.

FIGS. 6 to 9 show a third embodiment of support arrangement for mounting the disc-shaped thermistor 10 in an upright position, i.e. perpendicular to but with its edge spaced from substrate (not shown). The arrangement comprises two supports 22, 24, each formed from a strip of sheet metal having margins along its opposite edges and bent through 90°, to form a channel-section. The two supports 22, 24 are secured to the opposite sides of the thermistor 10 and project beyond the edge of the thermistor: these ends of the supports are bent outwardly to form contact pads 23, 25 which lie in a common plane, for mounting to the substrate. The support 22 extends across the full diameter of the thermistor 10 and projects beyond the opposite edge thereof: V-shaped cut-outs have been formed in the opposite margins of the channel-section and then the support has been bent through 90° to form a portion 22a lying across the edge of the thermistor. The portion 22a provides a flat top to facilitate vacuum pick-up of the component.

The supports 12, 14 of the arrangement shown in FIGS. 2 to 5 and the supports 22, 24 of the arrangement shown in FIGS. 6 to 9 provide the advantage that they can be made of thin metal and so conduct very little heat. Also because the supports engage the disc via the edges of the metal only, minimal heat can transfer away from the disc under conditions of high electrical power. However, the arrangement provides good mechanical support for the thermistor 10.

The thermistors shown in FIGS. 1 to 5 can be surface-mounted to a substrate by means of the contact pads 13, 15, such that the disc 10 lies parallel to but spaced by a small gap from the substrate. The thermistor sown in FIGS. 6 to 9 can be mounted in an upright position on the substrate. The supports provide electrical connection to the thermistor, but also provide thermal connection. The dissipation of heat from the thermistor is controlled by the supports, in dependence upon the surface area, cross-sectional area, contact pad area and material of the supports, and also the distance between the underside of the disc 10 and the substrate. For example, a window (not shown) may be formed in the portion 12b of the support 12 of FIGS. 2 to 5, so as to reduce its cross-sectional area, thereby reducing the amount of heat conducted away from the thermistor. Similarly, a window 22b may be formed in the support 22 adjacent the portion 22a in FIGS. 6 to 9, and/or cut-outs e.g. 26 may be formed in the supports 22, 24 adjacent the contact pads 23, 25.

I claim:

1. A temperature dependent resistive component comprising opposite contact faces and two supports attached to the respective contact faces, each support having at least one projecting leg which terminates in a contact pad, with respective contact pads of the two supports lying in a common plane spaced outwardly from said component, for mounting the component to a substrate, at least one support comprising a piece of sheet metal bent into a channel-section and having two edges of the channel-section bonded to the respective face of the component.

2. A temperature dependent resistive component as claimed in claim 1, in which the or each support comprises a portion of its piece of sheet metal which is bent to lie in said common plane.

3. A temperature dependent resistive component as claimed in claim 2 in which said common plane, in which said contact pads of the two supports lie, is substantially parallel to but spaced from one of said opposite faces of said component.

4. A temperature dependent resistive component as claimed in claim 2 in which said common plane, in which said contact pads of the two supports lie, is substantially perpendicular to said opposite faces of the component and spaced from the edge of the component.

* * * * *